US008773174B2

(12) United States Patent
Wang et al.

(10) Patent No.: US 8,773,174 B2
(45) Date of Patent: Jul. 8, 2014

(54) RAIL TO RAIL DIFFERENTIAL BUFFER INPUT STAGE

(71) Applicants: Yang Wang, Suzhou (CN); Jianzhou Wu, Suzhou (CN); Xiuqiang Xu, Suzhou (CN); Yizhong Zhang, Suzhou (CN)

(72) Inventors: Yang Wang, Suzhou (CN); Jianzhou Wu, Suzhou (CN); Xiuqiang Xu, Suzhou (CN); Yizhong Zhang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/716,194

(22) Filed: Dec. 16, 2012

(65) Prior Publication Data
US 2014/0139267 A1     May 22, 2014

(51) Int. Cl.
*H03B 1/00*  (2006.01)
*H03K 3/00*  (2006.01)

(52) U.S. Cl.
CPC .................................... *H03K 3/00* (2013.01)
USPC .............................. 327/108; 327/65; 327/563

(58) Field of Classification Search
USPC .............. 327/63–65, 108, 563; 330/253, 258, 330/261
See application file for complete search history.

(56) References Cited

U.S. PATENT DOCUMENTS

| 7,157,970 | B2 | 1/2007 | Dawes |
| 7,764,123 | B2 | 7/2010 | Kimura |
| 8,289,077 | B2 * | 10/2012 | Bruin ............................ 330/258 |
| 2010/0253432 | A1 * | 10/2010 | Bruin ............................ 330/257 |
| 2011/0298541 | A1 * | 12/2011 | Shi ................................ 330/261 |

OTHER PUBLICATIONS

William Redman-White, "A High Bandwidth Constant gm and Slew-Rate Rail-to-Rail CMOS Input Circuit and its Application to Analog Cells for Low Voltage VLSI Systems", IEEE Journal of Solid-State Circuits, vol. 32, No. 5, May 1997.
Klaas-Jan De Langen and Johan H. Huijsing, "Compact Low-Voltage Power-Efficient Operational Amplifier Cells for VLSI", IEEE Journal of Solid-State Circuits, vol. 33, No. 10, October 1998.
Guo-Ding Dai, Peng Huang, Ling Yang and Bo Wang, "A Constant Gm CMOS Op-Amp with Rail-to-Rail input/output stage", 978-1-4244-5798-4/10/$26.00 © 2010 IEEE.

* cited by examiner

*Primary Examiner* — Long Nguyen
(74) *Attorney, Agent, or Firm* — Charles Bergere

(57) ABSTRACT

A rail to rail differential buffer input stage includes n-type and p-type input differential transistor pairs connected in voltage follower configuration to the power supply rails. A reference voltage generator includes a reference differential transistor pair generating a dynamic reference voltage relative to the common mode input voltage. Dummy n-type and p-type transistor pairs have current conducting paths connected in parallel with the input differential pairs and are controlled by the dynamic reference voltage to divert supply rail current away from and deactivate one of the associated input differential pairs when the common mode input voltage is further from the dynamic reference voltage than a threshold value. Both the dummy pairs conduct and both the input differential pairs are activated when the common mode input voltage is closer to the dynamic reference voltage $V_B$ than the threshold value so that the overall transconductance of the buffer input stage remains constant.

10 Claims, 4 Drawing Sheets

RAIL TO RAIL DIFFERENTIAL BUFFER INPUT STAGE

BACKGROUND OF THE INVENTION

The present invention is directed to an input buffer circuit and, more particularly, to a rail to rail differential buffer input stage that has operational characteristics that are maintained for common mode input voltages varying over substantially the whole voltage difference between the voltages at the power supply rails.

A rail to rail differential buffer input stage may be used to drive an operational amplifier or a comparator for example. Such circuits are increasingly required to operate with reduced power supply voltages, especially in very large-scale integrated (VLSI) circuits. At the same time, larger variations of common mode analog input voltages are encountered, due to noise levels from neighboring digital circuits. The differential buffer input stage provides differential output currents that can be summed to amplify the differential input signal, and block the common mode voltage variations from the output signal.

One configuration of a rail to rail differential buffer input stage includes n-type and p-type input differential pairs of transistors, such as metal-oxide semiconductor field effect transistors (MOSFETs), which are connected in a voltage follower configuration to the power supply rails. The n-type input differential pair conduct when the common mode input voltage is closer to the high power supply voltage and the p-type input differential pair conduct when the common mode input voltage is closer to the low power supply voltage. When the common mode input voltage is at a value intermediate to the high and low power supply voltages, both the n-type and p-type input differential pairs conduct and the transconductance of the input stage, that is to say the variation in its differential output current for a small unit variation in differential input voltage, is double the transconductance $g_m$ of a single input differential pair. However, n-type and p-type dummy pairs of transistors, which are driven by the common mode input voltage but not by the differential input of the input stage, can be added in parallel with the n-type and p-type input differential pairs of transistors. One or the other of the dummy pairs conducts when the common mode input voltage is not close to the intermediate voltage and diverts the tail current directly to the output of the stage and away from the respective input differential pair, switching it OFF, so that the transconductance of the input stage corresponds to the transconductance $g_m$ of the other, single input differential pair. When the common mode input voltage is close to the intermediate voltage, both the dummy pairs of transistors conduct, halving the tail current and the transconductance $g_m$ of each of the respective input differential pairs, and the total transconductance of the input stage is maintained at an almost constant value of $g_m$.

The intermediate voltage at which the dummy differential pairs are turned ON and OFF can be a fixed voltage, defined by a resistor chain forming a voltage divider connected between the power supply rails. However, the resistance of the voltage divider must be high to avoid high static current consumption, which consumes a large area of the semiconductor chip. This and other ways of generating the intermediate voltage also cannot adapt readily to the effects of manufacturing process variations on the characteristics of MOSFETs, especially if these are run at sub-threshold voltages.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

Figure 1:
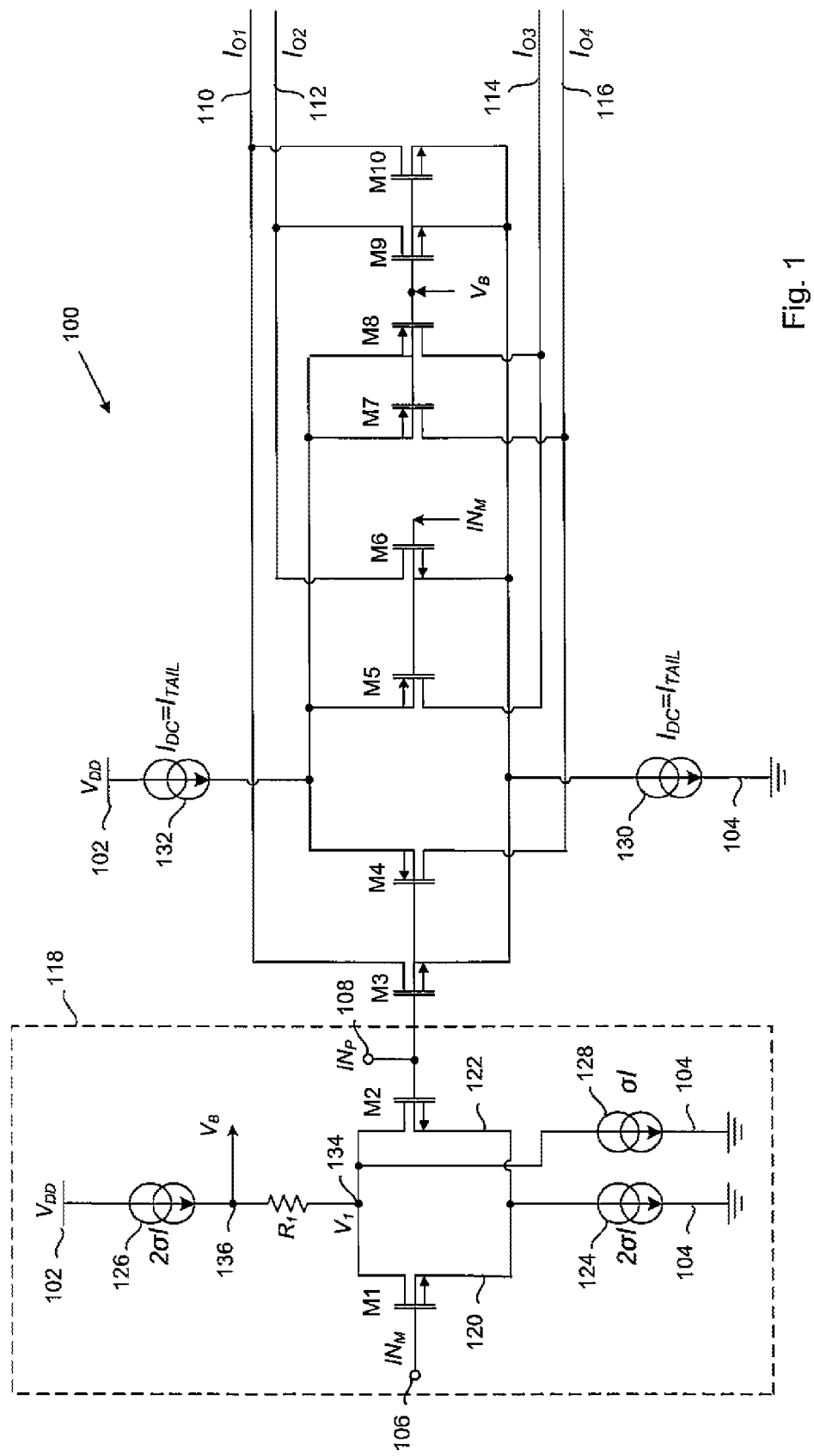
FIG. 1 is a schematic circuit diagram of a rail to rail differential buffer input stage in accordance with one embodiment of the invention, given by way of example.
Figure 2:
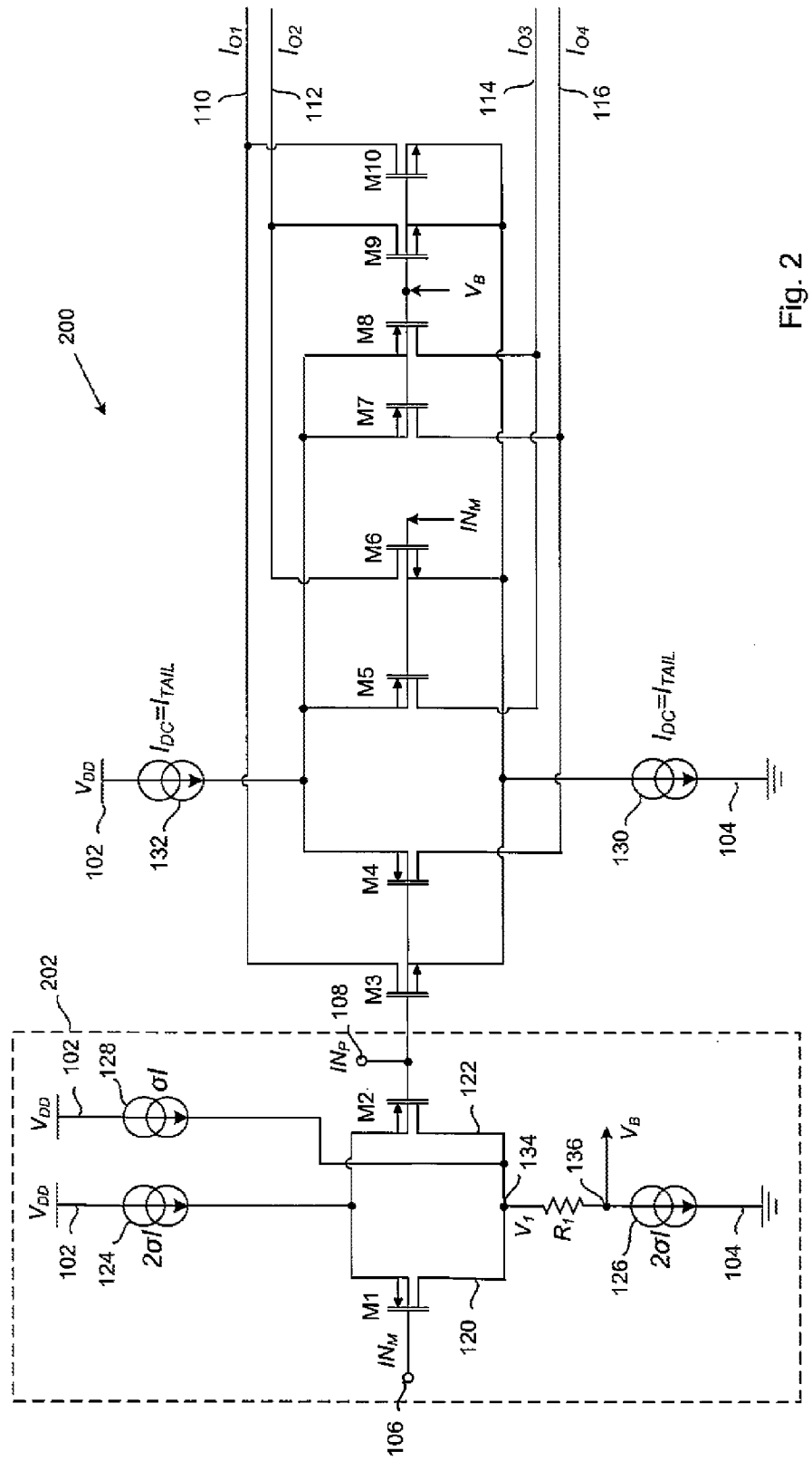
FIG. 2 is a schematic circuit diagram of a rail to rail differential buffer input stage in accordance with another embodiment of the invention, given by way of example.

FIGS. 1 and 2 illustrate examples of rail to rail differential buffer input stages 100 and 200 in accordance with embodiments of the invention. Each of the input stages 100 and 200 comprises a high voltage power supply rail 102 and a low voltage power supply rail 104, a pair of input terminals 106 and 108 and a plurality of output paths 110, 112, 114 and 116. Each of the input stages 100 and 200 includes an n-type input differential pair of transistors M3 and M6 and a p-type input differential pair of transistors M4 and M5 for receiving a differential input signal $IN_M - IN_P$ from the input terminals 106, 108 and supplying respective differential output current signals $I_{O1}, I_{O2}, I_{O3}$ and $I_{O4}$, on respective output paths 110, 112, 114 and 116 when activated. The n-type and p-type input differential pairs of transistors M3, M6 and M4, M5 are connected in voltage follower configuration to the low voltage power supply rail 104 and to the high voltage power supply rail 102 respectively. Each of the input stages 100 and 200 also includes a reference voltage generator 118 or 202 including a reference differential pair of transistors M1 and M2 for receiving the differential input signal $IN_M - IN_P$, from the input terminals 106, 108 and generating a dynamic reference voltage $V_B$ which is greater or less a common mode voltage $(IN_M + IN_P)/2$ of the differential input signal $IN_M - IN_P$ when the common mode voltage is respectively less or greater than an intermediate value, where the intermediate value is a voltage value of the common mode voltage that makes both the n-type and p-type input differential pairs of transistors M3, M6 and M4, M5 conduct. Each of the input stages 100 and 200 also includes an n-type dummy pair of transistors M9 and M10 and a p-type dummy pair of transistors M7 and M8. The n-type dummy pair of transistors M9, M10 and p-type dummy pair of transistors M7, M8 have current conducting paths connected in parallel with current conducting paths of the n-type and p-type input differential pairs of transistors respectively, the dummy pairs of transistors being controlled by the dynamic reference voltage $V_B$. The n-type or the p-type dummy pair of transistors M9, M10 or M7, M8 conduct to divert supply rail current away from and deactivate the associated transistors M6, M3 or M4, M5 of respective n-type or p-type input differential pairs when the common mode voltage $(IN_M + IN_P)/2$ of the differential input signal $IN_M - IN_P$ is further from the dynamic reference voltage $V_B$ than a threshold value $V_{TH}$, both the dummy pairs M9, M10 and M7, M8 conducting and both the input differential pairs M6, M3 and M4, M5 being activated when the common mode voltage $(IN_M+IN_P)/2$ of the differential input signal $IN_M-IN_P$ is closer to the dynamic reference voltage $V_B$ than the threshold value $V_{TH}$.

In these examples, the transistors are metal-oxide semiconductor field-effect transistors (MOSFETs). The reference differential pair of transistors M1 and M2 have similar channel width and length and process characteristics to one of the input differential pairs but smaller size. In the case of the example illustrated in FIG. 1, the reference differential pair of transistors M1 and M2 are n-type MOSFETs that have similar channel width to length ratio and process characteristics to the n-type input differential pairs of transistors M3 and M6. In the case of the example illustrated in FIG. 2, the reference differential pair of transistors M1 and M2 are p-type MOSFETs that have similar channel width to length ratio and process characteristics to the p-type input differential pairs of transistors M4 and M5.

In these examples, the dummy pairs of transistors M9, M10 and M7, M8 have similar size, channel width and length and process characteristics to respective ones of the input differential pairs M6, M3 and M4, M5. The n-type and p-type dummy pairs of transistors M9, M10 and M7, M8 conducting diverts supply rail current $I_{TAIL}$ away from the associated transistors M6, M3 and M4, M5 of respective n-type and p-type input differential pairs to their output signal paths 110, 112, 114 and 116. The reference differential pair of transistors M1 and M2 receives the differential input signal $IN_M-IN_P$ from the input terminals 106, 108. The reference voltage generator 118, 202 has parallel reference current conducting paths 120 and 122 including respective ones of the reference differential pair of transistors M1 and M2, first and second reference current sources 124 and 126 connected in series between respective ones of the power supply rails 104 and 102 and the parallel combination of the reference current conducting paths 120 and 122. A third reference current source 128 is connected in parallel with the series combination of the first reference current source 124 and the reference current conducting paths 120, 122, the reference voltage generator 118 providing a dynamic reference voltage $V_B$ across the second reference current source 126. The reference voltage generator may include a resistive element $R_1$ in series between the second reference current source 126 and the parallel combination of the reference current conducting paths 120, 122.

The voltage follower configurations of the input differential pairs of transistors M3, M6 and M4, M5 may include voltage follower current sources 130, 132 in series between respective power supply rails 104 and 102 and the associated combinations of input differential pairs of transistors M3, M6 and M4, M5 and dummy pairs of transistors M9, M10 and M7, M8, and the reference current sources 124, 126 and 128 supply currents smaller than the voltage follower current sources 130 and 132. The reference differential pair of transistors M1 and M2 may be of smaller size than the input differential pairs of transistors M3, M6 and M4, M5. The third reference current source 128 may supply currents smaller than the first and second reference current sources 124 and 126.

The rail to rail differential buffer input stages 100 and 200 may be connected with an operational amplifier or a comparator stage (not shown) for example, which may operate in class AB. Various suitable configurations are known for such an output stage.

In more detail, in the rail to rail differential buffer input stages 100 and 200 of FIGS. 1 and 2, the MOSFETs M1 to M10 operate in the sub-$V_T$ region, that is to say that the current flowing in their drain-source current conduction paths is a sub-threshold small leakage current, which varies exponentially with the gate voltage, even when the gate voltage is below the threshold voltage $V_T$. All the MOSFETs M1 to M10 have the same channel width to length ratio. The MOSFETs M1 and M2 are 1/m times the size of the MOSFETs M3 to M10 and the MOSFETs M3 to M10 are all the same size. The bias currents $I_{TAIL}$ from the voltage follower current sources 130, 132 are m times the current capacities 2σI of the first and second reference current sources 124 and 126. The current capacity of the third reference current source 128 is σI, half that of the first and second reference current sources 124 and 126.

The voltage at the input terminals 106, 108 is applied to the gates of the reference differential pair of transistors M1 and M2. In the rail to rail differential buffer input stage 100 of FIG. 1, the reference differential pair of transistors M1 and M2 are n-type MOSFETs. The sources of the transistors M1 and M2 are connected to the low-voltage power supply rail 104 (shown in the drawings as ground) through the first reference current source 124. The drains of the transistors M1 and M2 are connected to a node 134, which is connected to the high-voltage power supply rail 102 (shown in the drawings as $V_{DD}$) through the series connection of the resistive element $R_1$ and the second reference current source 126. The dynamic reference voltage $V_B$ is generated at a node 136 between the resistive element $R_1$ and the second reference current source 126. The third reference current source 128 is connected between the node 134 and the low-voltage power supply rail 104.

Figure 3:
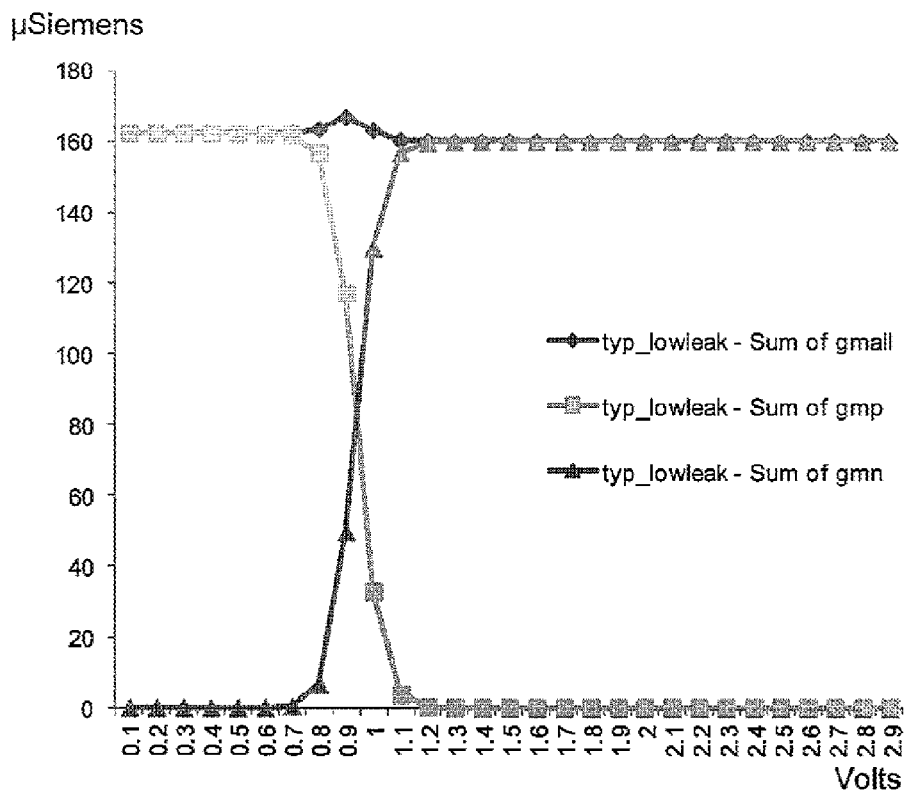
FIGS. 3 and 4 are graphs of transconductance of modules in the rail to rail differential buffer input stages of FIGS. 1 and 2 respectively as a function of common mode input voltage.

FIG. 3 shows the transconductance $g_{mn}$ of the n-type input differential pair of transistors M3, M6, the transconductance $g_{mp}$ of the p-type input differential pair of transistors M4, M5, and the combined transconductance $g_{mall}$ of the two pairs together. When the common mode voltage $(IN_M+IN_P)/2$ of the differential input signal $IN_M-IN_P$, from the input terminals 106, 108 is close to the voltage (ground) of the low-voltage power supply rail 104, the reference differential pair of transistors M1 and M2 conduct little current and present a high resistance. The current through the first reference current source 124 is small compared to that through the third reference current source 128. The current capacity of the third reference current source 128 is less than that of the second reference current source 126, which pulls the voltage $V_1$ at the node 134 and the dynamic reference voltage $V_B$ at the node 136 up towards the voltage $V_{DD}$ of the high-voltage power supply rail 102, higher than the common mode voltage $(IN_M+IN_P)/2$. The gate-source voltage of the n-type input differential pair of transistors M3, M6 is smaller than the gate-source voltage of the n-type dummy pair of transistors M9 and M10. The n-type dummy pair of transistors M9 and M10 conduct to divert supply rail current $I_{TAIL}$ away from and deactivate the associated transistors M6, M3, whose transconductance $g_{mn}$ is zero in this condition. The p-type dummy pair of transistors M7 and M8 do not divert rail current $I_{TAIL}$ away from the associated transistors M4, M5, whose transconductance $g_{mp}$ is maximum in this condition.

When the common mode voltage $(IN_M+IN_P)/2$ of the differential input signal $IN_M-IN_P$ from the input terminals 106, 108 is close to the voltage $V_{DD}$ of the high-voltage power supply rail 102, the reference differential pair of transistors M1 and M2 conduct more current and present a relatively low resistance. The current capacity of the first reference current source 124 is added to that of the third reference current source 128 and the currents together are greater than the capacity of the second reference current source 126. The voltage $V_1$ at the node 134 and the dynamic reference voltage $V_B$ at the node 136 are pulled down towards the voltage (ground) of the low-voltage power supply rail 104, below the common mode voltage $(IN_M+IN_P)/2$. The gate-source voltage of the p-type input differential pair of transistors M4, M5 is bigger than the gate-source voltage of the p-type dummy pair of transistors M7 and M8. The p-type dummy pair of transistors M7 and M8 conduct to divert supply rail current $I_{TAIL}$ away from and deactivate the associated transistors M4, M5, whose transconductance $g_{mp}$ is zero in this condition. The n-type dummy pair of transistors M9 and M10 do not divert rail current $I_{TAIL}$ away from the associated transistors M6, M3, whose transconductance $g_{mn}$ is maximum in this condition.

When the common mode voltage $(IN_M+IN_P)/2$ of the differential input signal $IN_M-IN_P$ from the input terminals 106, 108 is at a value intermediate between the voltage $V_{DD}$ of the high-voltage power supply rail 102 and the voltage (ground) of the low-voltage power supply rail 104, the reference differential pair of transistors M1 and M2 conduct moderately more current, so that the first reference current source 124 begins to pull their source voltage down. The common mode voltage $(IN_M+IN_P)/2$ of the differential input signal $IN_M-IN_P$ at the input terminals 106, 108 causes the gate-source voltage of the reference differential pair of transistors M1 and M2 to increase until the voltage $V_1$ at the node 134 and the dynamic reference voltage $V_B$ at the node 136 are at a level similar to the common mode voltage $(IN_M+IN_P)/2$. Both the two dummy pairs of transistors M7, M8 and M9, M10 conduct but only divert half $I_{TAIL}/2$ of the rail current away from the associated transistors M4, M5, and M6, M3, which are not deactivated but whose transconductances $g_{mp}$ and $g_{mn}$ are halved in this condition. The overall transconductance $g_{mp}+g_{mn}=g_{mall}$ is maintained nearly constant in all three of these conditions. In one example of the rail to rail differential buffer input stage 100, the difference between the overall transconductance $g_{mall}$ when both the two input differential pairs of transistors M4, M5, and M6, M3 conduct and the overall transconductance $g_{mall}$ when only one of the input differential pair of transistors M4, M5 or M6, M3 conducts was no more than 4%.

The rail to rail differential buffer input stage 200 of FIG. 2, differs from the buffer input stage 100 of FIG. 1 in that the reference voltage generator 202 is inverted compared to the reference voltage generator 118 of FIG. 1. The reference voltage generator 202 has a p-type reference differential pair of transistors M1 and M2 instead of the n-type reference differential pair of transistors M1 and M2 of the reference voltage generator 118. The first and second reference current sources 124 and 126 are connected in series between the high-voltage power supply rail 104 and the low-voltage power supply rail 102 respectively and the parallel combination of the reference current conducting paths 120 and 122. The third reference current source 128 is connected in parallel with the series combination of the first reference current source 124 and the reference current conducting paths 120, 122.

Figure 4:
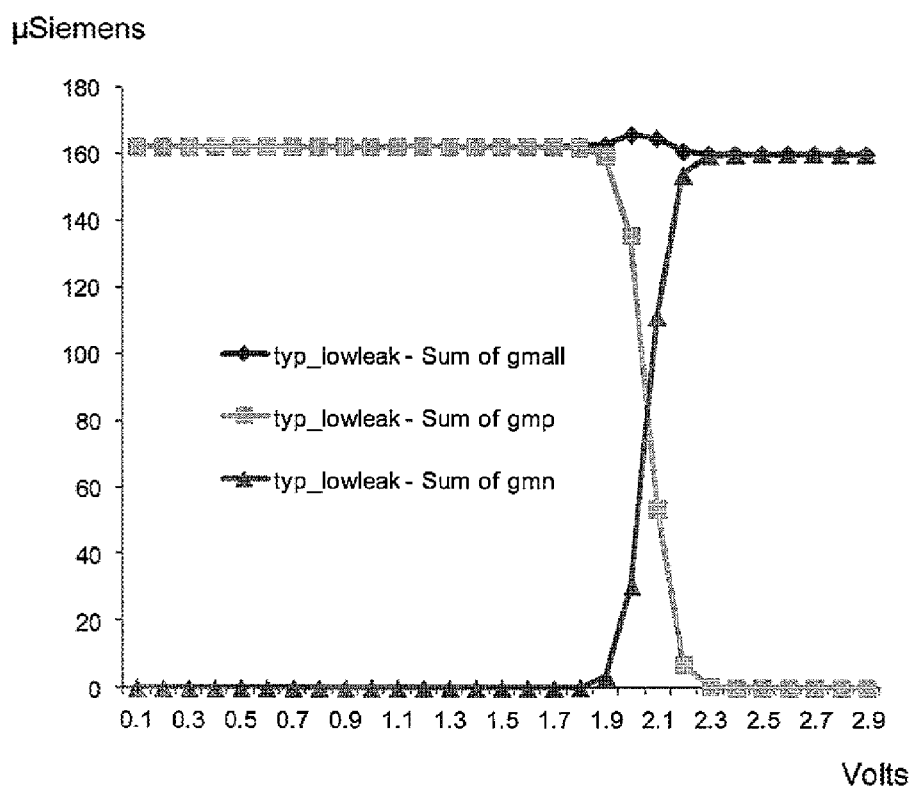

It will be appreciated that the operation of the reference voltage generator 202 and the transistors M3 to M10 is similar to but inverted compared to the reference voltage generator 118 and the transistors M3 to M10 as shown in FIG. 1. FIG. 4 illustrates the transconductance $g_{mn}$ of the n-type input differential pair of transistors M3, M6, the transconductance $g_{mp}$ of the p-type input differential pair of transistors M7, M8, and the combined transconductance $g_{mall}$ of the two pairs together for the rail to rail differential buffer input stage 200.

Figure 5:
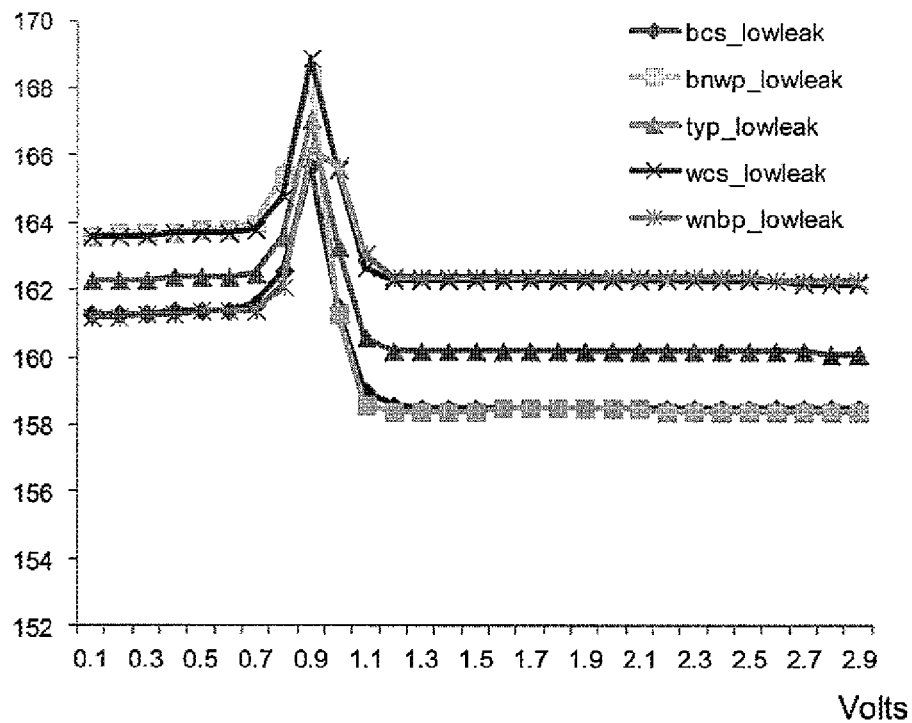
FIG. 5 is a graph of overall transconductance of the rail to rail differential buffer input stage of FIG. 1 as a function of common mode input voltage for different manufacturing process parameters.

The reference voltage generators 118 and 202 occupy a smaller chip area than if the reference voltage $V_B$ were generated by a high resistance voltage divider connected between the power supply rails. Moreover the rail to rail differential buffer input stages 100 and 200 are tolerant of manufacturing process variations. FIG. 5 illustrates the variations of overall transconductance $g_{mall}$ for examples of architecturally similar samples of the rail to rail differential buffer input stage 100 manufactured with different extreme manufacturing conditions, referred to commonly as process corners. The process corners illustrated in FIG. 5 are best-case ('bcs'), best-n-worst-p ('bnwp'), median ('typ'), worst-case ('wcs'), and worst-n-best-p ('wnbp'). It will be seen that the different process corners all switch transconductance at the same common-mode input voltage.

Figure 6:
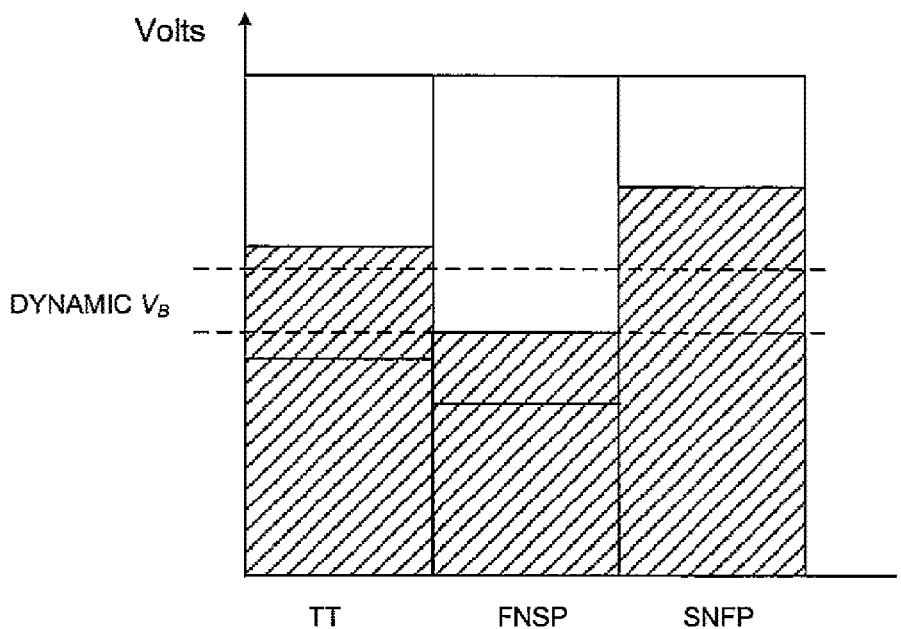
FIG. 6 is a diagram showing the relation between a dynamic reference voltage and voltage specifications of modules in the rail to rail differential buffer input stage of FIG. 1 for different manufacturing process corners.

FIG. 6 illustrates the variations of overall transconductance for examples of architecturally similar samples of the rail to rail differential buffer input stage 100 at different process corners and the adaptation of the dynamic reference voltage $V_B$ to the different process corners typical-typical ('TT') fast-n-slow-p ('FNSP') and slow-n-fast-p ('SNFP'). The hatched areas illustrate the maximum and minimum dynamic reference voltages $V_B$ at which these process corners switch correctly. If the dynamic reference voltage $V_B$ at which the different process corners switch transconductance were fixed, there would be process corners at which the transconductance switch was unacceptable. However, the dynamic reference voltage $V_B$ of the buffer input stages 100 and 200 adapts dynamically to the different process corners, enabling the transconductance switch to remain acceptable even for process corners requiring different reference voltages $V_B$.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between functional blocks are merely illustrative and that alternative embodiments may merge functional blocks or circuit elements or impose an alternate decomposition of functionality upon various functional blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated"

such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A rail to rail differential buffer input stage, comprising:
    a high voltage power supply rail and a low voltage power supply rail, a pair of input terminals and a plurality of output paths;
    n-type and p-type input differential pairs of transistors for receiving a differential input signal from said pair of input terminals and supplying respective differential output current signals on the plurality of output paths when activated, and connected in voltage follower configuration to said low voltage power supply rail and to said high voltage power supply rail respectively;
    a reference voltage generator including a reference differential pair of transistors for receiving the differential input signal from said pair of input terminals and generating a dynamic reference voltage that is greater or less than a common mode voltage of the differential input signal when said common mode voltage is respectively less or greater than an intermediate value, wherein the intermediate value is a voltage value of said common mode voltage that makes the n-type and p-type input differential pairs of transistors conduct; and
    n-type and p-type dummy pairs of transistors having current conducting paths connected in parallel with current conducting paths of said n-type and p-type input differential pairs of transistors respectively, said dummy pairs of transistors being controlled by said dynamic reference voltage;
    wherein said n-type or said p-type dummy pair of transistors conducts to divert supply rail current away from and deactivate the associated transistors of respective n-type or p-type input differential pairs when said common mode voltage of said input signal is further from said dynamic reference voltage than a threshold value, both said dummy pairs conducting and both said input differential pairs being activated when said common mode voltage of said input signal is closer to said dynamic reference voltage than said threshold value.

2. The rail to rail differential buffer input stage of claim 1, wherein said transistors are metal-oxide semiconductor field-effect transistors (MOSFETs).

3. The rail to rail differential buffer input stage of claim 2, wherein said reference differential pair of transistors have similar channel width to length ratio and process characteristics to one of said input differential pairs but smaller size.

4. The rail to rail differential buffer input stage of claim 2, wherein said dummy pairs of transistors have similar size, channel width to length ratio and process characteristics to respective ones of said input differential pairs.

5. The rail to rail differential buffer input stage of claim 1, wherein said n-type and p-type dummy pairs of transistors conducting diverts supply rail current away from the associated transistors of respective n-type and p-type input differential pairs to the output paths.

6. The rail to rail differential buffer input stage of claim 1, wherein said reference differential pair of transistors receives the differential input signal from said pair of input terminals, and said reference voltage generator has parallel reference current conducting paths including respective ones of said reference differential pair of transistors, first and second reference current sources connected in series between respective ones of said power supply rails and the parallel combination of said parallel reference current conducting paths, and a third reference current source connected in parallel with said first reference current source and the series combination of said reference current conducting paths, said reference voltage generator providing a reference voltage across said second reference current source.

7. The rail to rail differential buffer input stage of claim 6, wherein said reference voltage generator includes a resistive element in series between said second reference current source and the parallel combination of said reference current conducting paths.

8. The rail to rail differential buffer input stage of claim 6, wherein said voltage follower configurations of said input differential pairs of transistors include voltage follower current sources in series between respective power supply rails and the associated combinations of input differential pairs of transistors and dummy pairs of transistors, and said reference current sources supply currents smaller than voltage follower current sources.

9. The rail to rail differential buffer input stage of claim 8, wherein said reference differential pair of transistors is of smaller size than said input differential pairs of transistors.

10. The rail to rail differential buffer input stage of claim 6, wherein said third reference current source supplies currents smaller than said first and second reference current sources.

* * * * *